US009704846B1

(12) United States Patent
Haigh et al.

(10) Patent No.: US 9,704,846 B1
(45) Date of Patent: Jul. 11, 2017

(54) IC CHIPS CONTAINING A MIXTURE OF STANDARD CELLS OBTAINED FROM AN ORIGINAL SET OF DESIGN RULES AND ENHANCED STANDARD CELLS THAT ARE A SUBSTANTIALLY UNIFORM VARIANT OF THE ORIGINAL SET OF DESIGN RULES AND METHODS FOR MAKING THE SAME

(71) Applicant: PDF Solutions, Inc., San Jose, CA (US)

(72) Inventors: Jonathan Haigh, San Jose, CA (US); Elizabeth Lagnese, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 14/991,872

(22) Filed: Jan. 8, 2016

Related U.S. Application Data

(63) Continuation-in-part of application No. 14/289,321, filed on May 28, 2014, now abandoned.

(60) Provisional application No. 62/275,511, filed on Jan. 6, 2016, provisional application No. 61/887,271, filed on Oct. 4, 2013, provisional application No. 62/186,677, filed on Jun. 30, 2015.

(51) Int. Cl.
*H01L 27/118* (2006.01)
*H01L 27/02* (2006.01)
*G06F 17/50* (2006.01)
*H01L 23/528* (2006.01)

(52) U.S. Cl.
CPC ...... *H01L 27/0207* (2013.01); *G06F 17/5068* (2013.01); *H01L 23/528* (2013.01); *H01L 27/11807* (2013.01); *H01L 2027/11853* (2013.01); *H01L 2027/11864* (2013.01)

(58) Field of Classification Search
CPC ............ G06F 17/5068; G06F 17/5072; G06F 17/5077; G06F 17/5045; G06F 17/505; G06F 2217/64; H01L 27/0207; H01L 2924/0002; H01L 27/11803; H01L 2924/00; H01L 2924/14; H01L 2924/1433
See application file for complete search history.

(56) References Cited

U.S. PATENT DOCUMENTS

| | | | | |
|---|---|---|---|---|
| 2006/0243955 | A1* | 11/2006 | Fujimoto | G11C 5/02 257/1 |
| 2009/0249259 | A1* | 10/2009 | Penzes | G06F 17/5045 716/100 |
| 2010/0162187 | A1* | 6/2010 | Penzes | G06F 17/5068 716/122 |
| 2010/0289111 | A1* | 11/2010 | Lee | G06F 17/5072 257/499 |

* cited by examiner

*Primary Examiner* — Duy T Nguyen
(74) *Attorney, Agent, or Firm* — Pillsbury Winthrop Shaw Pittman LLP

(57) ABSTRACT

The present invention relates to IC chips containing a mixture of standard cells obtained from an original set of design rules and enhanced standard cells that are a variant of the original set of design rules and methods for making the same.

7 Claims, 7 Drawing Sheets

Standard Cell Library 100-O

Enhanced Standard Cell Library 100-N

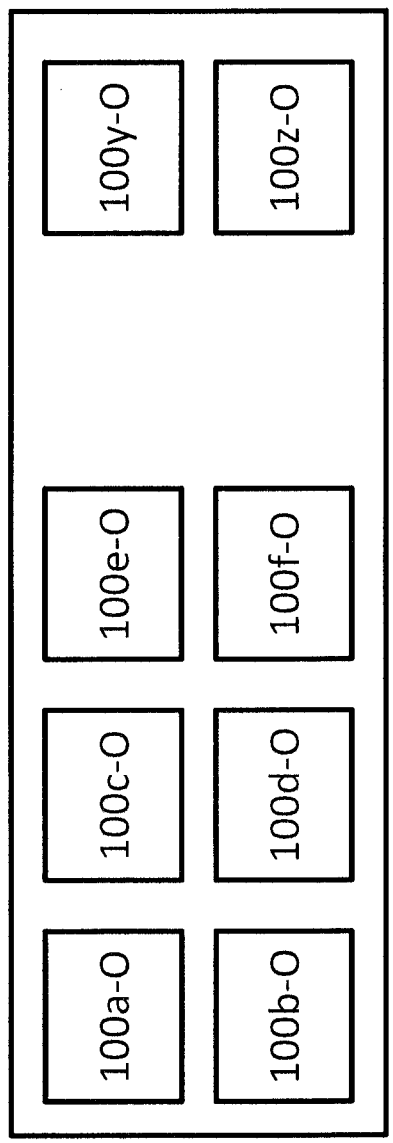
Fig 1(A) Standard Cell Library 100-O
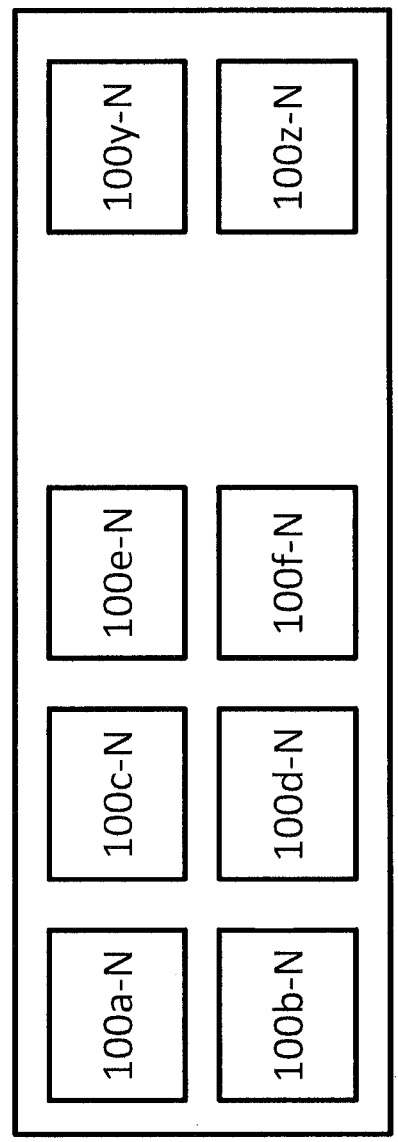
Fig 1(B) Enhanced Standard Cell Library 100-N

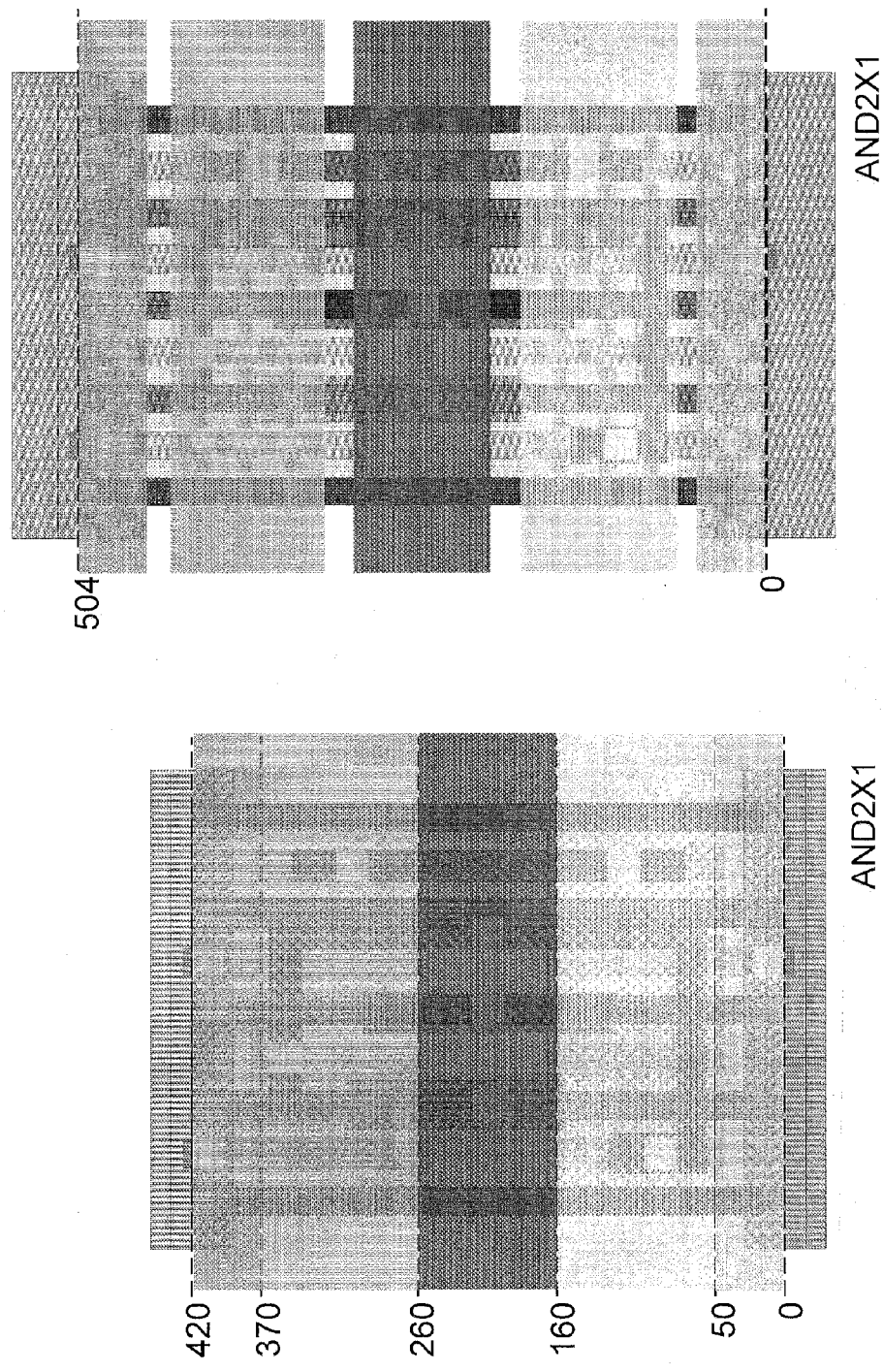
Figs. 5A-B

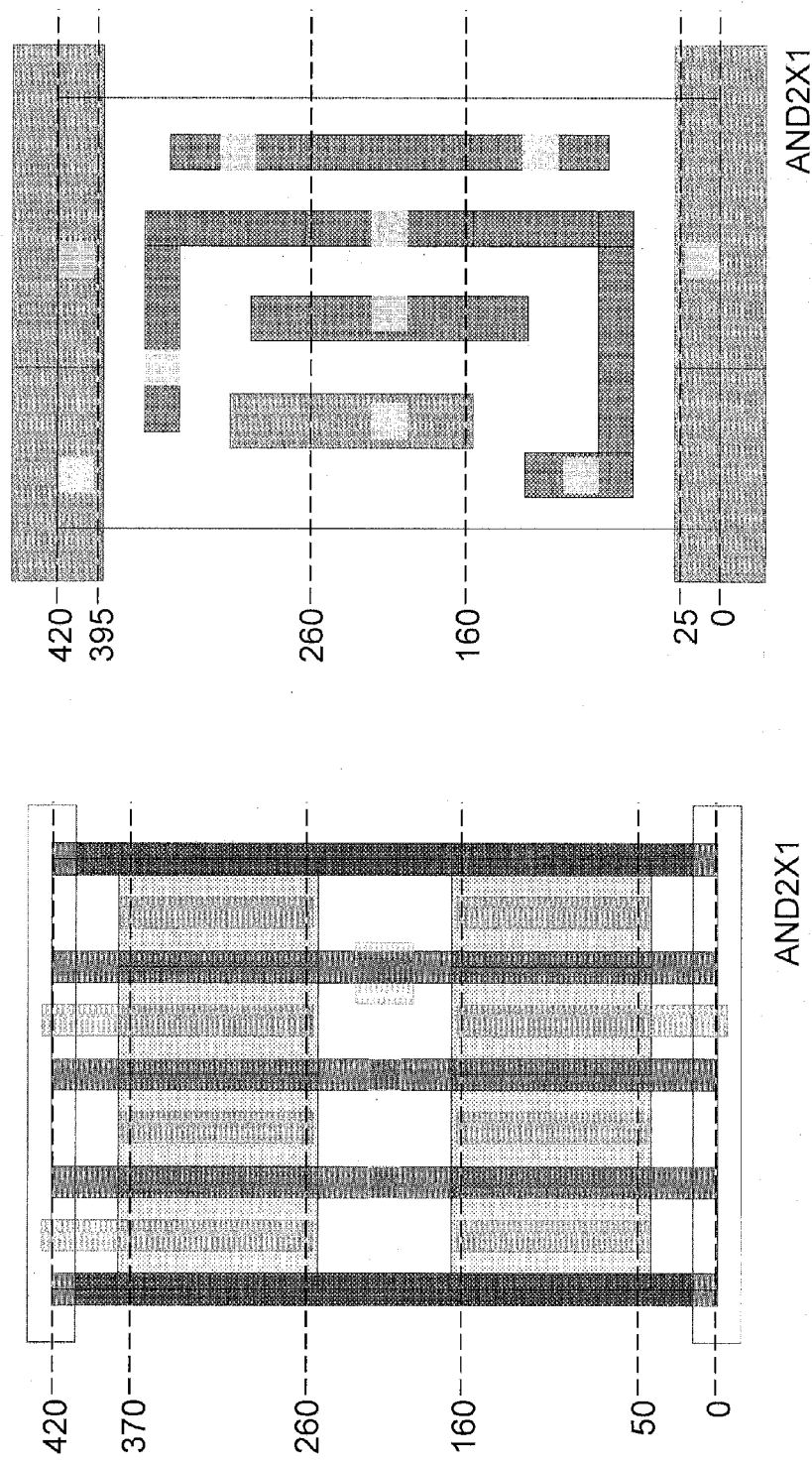
Fig. 6A-B

IC CHIPS CONTAINING A MIXTURE OF STANDARD CELLS OBTAINED FROM AN ORIGINAL SET OF DESIGN RULES AND ENHANCED STANDARD CELLS THAT ARE A SUBSTANTIALLY UNIFORM VARIANT OF THE ORIGINAL SET OF DESIGN RULES AND METHODS FOR MAKING THE SAME

CROSS-REFERENCE TO RELATED APPLICATION(S)

This application claims priority from Provisional Application Ser. No. 62/275,511 filed Jan. 6, 2016, which '511 application is HEREBY INCORPORATED BY REFERENCE and is a continuation-in-part of U.S. patent application Ser. No. 14/289,321, filed May 28, 2014, which '321 application is HEREBY INCORPORATED BY REFERENCE, and which '321 application claims priority from U.S. Pat. Applic. Ser. No. 61/887,271, entitled "Template Based Design with LibAnalyzer," filed Oct. 4, 2013, which '271 application is also HEREBY INCORPORATED BY REFERENCE.

FIELD OF THE INVENTION

The present invention relates generally to the field of integrated circuits, more specifically to integrated circuits that are designed/constructed to achieve high fabrication yield in deep submicron (e.g., 20 nm, 14 nm and below) processes, and also to such circuits rendered using standard cell techniques.

BACKGROUND OF THE INVENTION

Standard cells are a well-established technology for constructing integrated circuits (ICs), especially ICs that contain significant random logic sections, such as system-on-a-chip (SoC) ICs. See S. Saika, "Standard cell library and semiconductor integrated circuit," U.S. Pat. No. 8,302,057 B2 (incorporated by reference herein), J. J. Lee, et al., "Standard Cell Placement Technique For Double Patterning Technology," U.S. Pat. Applic. No. 20130036397 A1 (also incorporated by reference herein), D. D. Sherlekar, "Power Routing in Standard Cell Designs," U.S. Pat. Applic. No. 20120249182 A1 (also incorporated by reference herein), H. H. Nguyen, et al., "7-tracks standard cell library," U.S. Pat. No. 6,938,226 (also incorporated by reference herein), P. Penzes, et al., "High-speed low-leakage-power standard cell library," U.S. Pat. No. 8,079,008 (also incorporated by reference herein), H.-Y. Kim, et al., "Standard cell libraries and integrated circuit including standard cells," U.S. Pat. No. 8,174,052 (also incorporated by reference herein), and O. M. K. Law, et al., "Standard cell architecture and methods with variable design rules," U.S. Pat. No. 8,173,491 (also incorporated herein by reference) for examples of known standard-cell techniques.

As IC feature sizes continue to shrink, difficult-to-predict side effects of lithography and other fabrication processes have challenged the traditional standard cell model. At feature sizes of 28 nm, 22 nm and below, various restrictions—including new "design rules" and unpredictable interactions between features over longer relative distances—combine to create an environment in which traditional "scaling" of existing libraries to meet new design rules produces unacceptable manufacturing yields, unacceptable area efficiency, or both.

One approach to address these problems has been to impose additional "regularity" restrictions (i.e., restrictions beyond mere design rules) on the IC layouts. See, e.g., V. Kheterpal, V. Rovner, T. G. Hersan, D. Motiani, Y. Takegawa, A. J. Strojwas, and L. Pileggi. "Design methodology for IC manufacturability based on regular logic-bricks," DAC '05, pages 353-358; T. Jhaveri, V. Rovner, L. Liebmann, L. Pileggi, A. J. Strojwas, and J. D. Hibbeler, "Co-Optimization of Circuits, Layout and Lithography for Predictive Technology Scaling Beyond Gratings," IEEE Transactions on Computer-Aided Design of Integrated Circuits and Systems, 29(4):509-527, April 2010. Such restricted design approaches have been employed, for example, in U.S. Pat. No. 8,004,315 ("Process for making and designing an IC with pattern controlled layout regions") to Jhaveri, U.S. Pat. Applic. No. 20080137051 ("Lithography and Associated Methods, Devices, and Systems") to Maly, and U.S. Pat. Applic. No. 20100001321 ("Semiconductor Device Layout Having Restricted Layout Region Including Rectangular Shaped Gate Electrode Layout Features Defined Along At Least Four Gate Electrode Tracks with Corresponding Non-Symmetric Diffusion Regions") to Becker et al.

While the restricted approach can be usefully employed and can be effective in addressing the yield impact of unpredictable interactions in deep submicron processes, there remain certain commercially important applications on which restricted approaches can fall short. A prime example involves standard cell libraries. Such libraries typically include a large number (e.g., hundreds) of cells, including many that implement small logic functions. Implementing such libraries directly (i.e., with support for every cell) using restricted approaches typically leads to poor area efficiency. On the other hand, because the users of such libraries (e.g., fabless chip makers) often have large infrastructure investments (e.g., CAD systems, large collections of macro blocks) that depend on the features of particular libraries, there remains a significant need for translation or adaption of existing standard cell libraries to deep submicron processes in a way that avoids and/or reduces the unpredictable effects that can substantially diminish the yield of otherwise design-rule-clean cell libraries. The present invention addresses this, as well as other, needs.

SUMMARY

The present invention relates to IC chips containing a mixture of standard cells obtained from an original set of design rules with regularity restrictions and enhanced standard cells that are a variant of the original set of design rules with regularity restrictions and methods for making the same.

Further aspects of the invention relate to electronic systems (fixed or portable) that include at least a selected number (e.g., one, two, three, four) of the ICs of the type defined above, as well as other optional components, such as rechargeable power source(s).

And still further aspects of the invention relate to methods for making such ICs by, for example, instantiating at least selected numbers of said above-referenced "cells" and/or "means."

BRIEF DESCRIPTION OF THE DRAWINGS

The present invention is best understood with reference to the accompanying set of drawings, in which:

FIG. 1(A-B) illustrates an original standard cell library with regularity restrictions and an enhanced standard cell library with regularity restrictions.

FIGS. 5(a-b) illustrates two cells, FIG. 5(a) illustrating a standard cell and FIG. 5(b) illustrating an enhanced cell.

FIGS. 6(a-b) illustrates a different stretch point being used only at the power rail.

DETAILED DESCRIPTION OF THE PREFERRED EMBODIMENT

Described is a method that produces a chip design that includes a mixture of (1) standard cells obtained from an original set of design rules with regularity restrictions and (2) enhanced standard cells that are a variant of the original set of design rules with regularity restrictions and methods for making the same.

In these design, it is noted that the specifics of the enhanced standard cells that are implemented will still be based on specific design considerations, which, as known, include trade-offs between power, performance and area, also known as "PPA").

It is also noted that choosing a proper stretch point is significant to generating ideal starting points for a new cell, as proper stretch point choice will ensure that critical cell attributes that are to remain unchanged in fact are left unchanged. As examples, stretching closer to power rails can, in many circumstances, avoid making changes to critical cell attributes, and avoiding stretching at locations that include vias can also, in many circumstances, avoid making changes to critical cell attributes.

FIGS. 1(A-B) illustrates a standard cell libraries 100-O and 100-N (with "O" for "original" and with "N" for "new"/"enhanced"). In the standard cell library 100-O, all of the standard cells 100(a, b, c . . . z)-O are based on an original set of design rules with regularity restrictions, and the (a, b, c . . . z) is used as an illustrative set of cells, but is not limited to the 26 corresponding to the alphabet, but is any number of different cells that are designed with the original set of design rules. In the standard cell library 100-N, these enhanced standard cells 100(a, b, c, . . . z)-N that are a substantially uniform variant of the standard cells 100(a, b, c, . . . z)-O, and which are based on an enhanced set of design rules. As with the standard library 100-O, in the standard cell library 100-N the (a, b, c . . . z) is used as an illustrative set of cells, but is not limited to the 26 corresponding to the alphabet, but is any number of different cells that are designed with the enhanced set of design rules.

Figure 2:
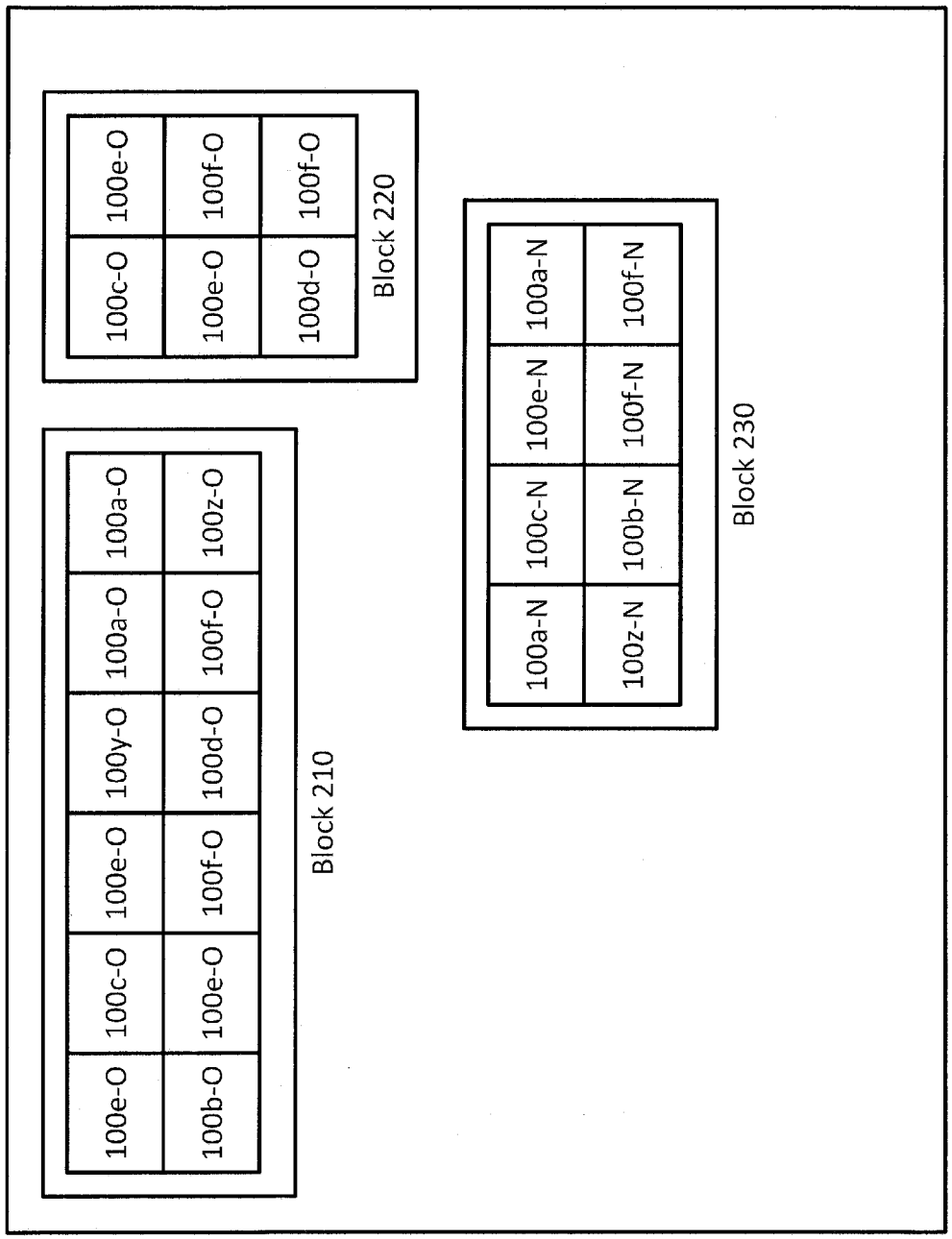
FIG. 2 illustrates an IC layout that includes certain corresponding enhanced standard cells that are a substantially uniform variant of the original set of design rules with regularity restrictions, as well as other cells that are from the original set of design rules with regularity restrictions.

FIG. 2 shows the layout of an integrated circuit 200, which in the examples is comprised of three blocks 210, 220, and 230. Block 210 and 220 are comprised exclusively of the original standard cells 100*-O, while block 230 is comprised exclusively of the enhanced standard cells 100*-N. In a preferred embodiment, regions of enhanced standard cells 100*-N are adjacent to each other, such as block 230 as shown, with no original standard cells in between.

Figure 3:
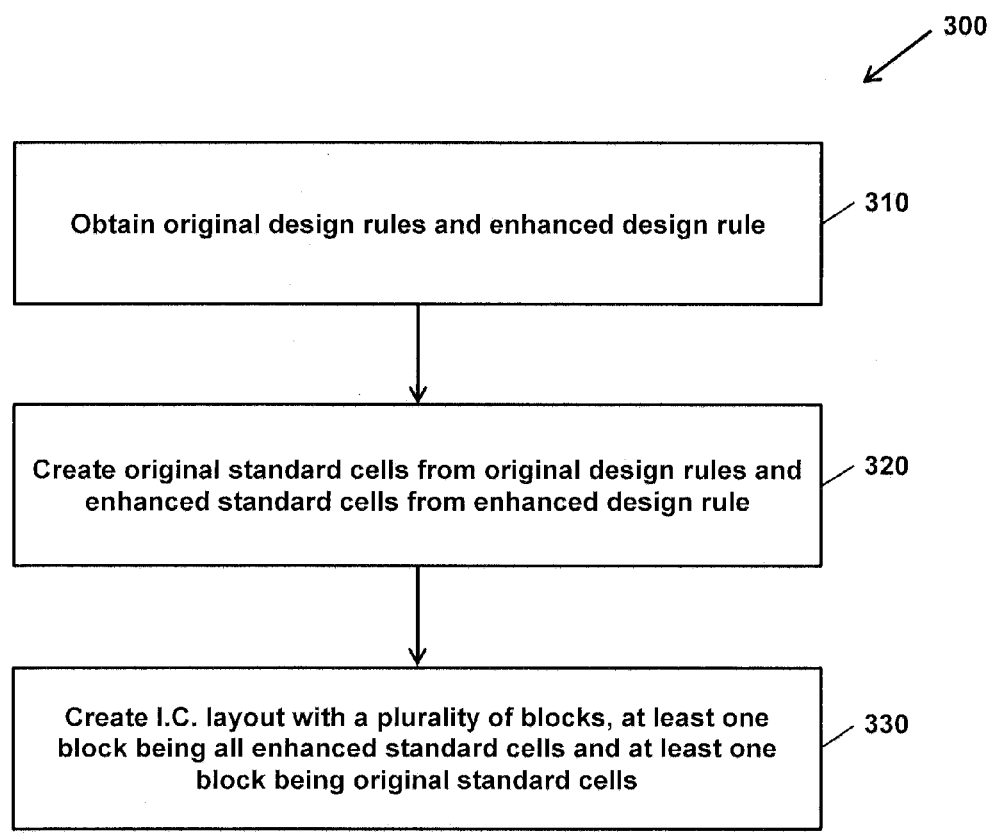
FIG. 3 illustrates a flow diagram of the method steps involved in making the IC layout shown in FIG. 2.

FIG. 3 illustrates a flow diagram 300 of the method steps used to create an integrated circuit as illustrated in FIG. 2. In step 310, original design rules and enhanced design rules are obtained.

Step 320 follows, in which the standard cells, such as 100*-O, are created for the standard cell library 100-O, each with regularity restrictions, and the enhanced standard cells, such as 100*-N, are created for the enhanced standard cell library 100-N, each with regularity restrictions.

Step 330 follows step 320, in which the integrated circuit, such as illustrated in FIG. 2 above, is created, with each block being made exclusively either of the standard cells 100*-O or the enhanced standard cells 100*-N.

It should be noted that the design rules for the enhanced standard cells is adapted from the original design rules to accommodate for increased power and/or performance, which can include increased transistor gate widths, a lengthening of conductor lines, such as power rails, or increased horizontal poly widths. In addition, variants of these can be made, such that certain blocks are increased in power and/or performance more than other blocks, which is instantiated by the certain blocks with increased power and/or performance more than other blocks having proportionally wider gate widths, for example.

Also, with respect to the creation of the enhanced standard cell library 100-N, in many cases this library will contain functionally identical standard cells as compared to the standard cell library 100-O. In other instances, the libraries may differ slightly since the higher level functions implemented may be different. In this regard, in certain embodiments, typical functions of the enhanced set of enhanced standard cells includes at least one of increased transistor gate widths, a lengthening of conductor lines, such as power rails, or increased horizontal poly widths, whereas typical functions of the original set of standard cells include critical patterns that remain unchanged, such as areas with vias for which stretching is not viable.

Figure 4:
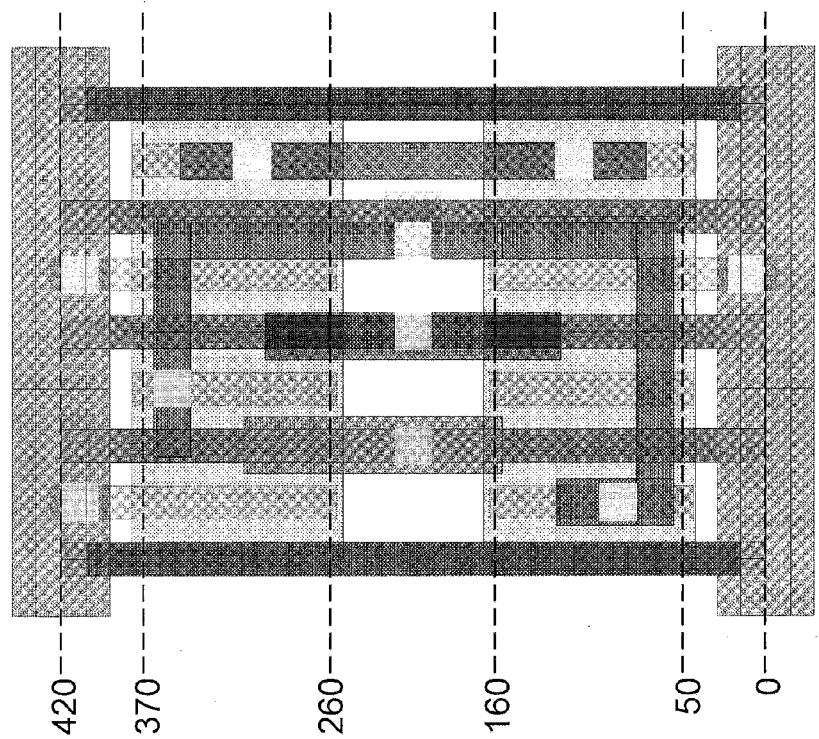
FIG. 4 illustrates a specific implementation in which a single standard cell is stretched using a substantially uniform variant of both increased.

FIG. 4 illustrates a specific implementation in which a single standard cell is stretched using a substantially uniform variant of both increased.

FIGS. 5(a-b) illustrates two cells, FIG. 5(a) illustrating a standard cell 500-0 made from the cell library 100-O, and FIG. 5(b) illustrating enhanced cell 500-N made from the cell library 100-N that is formed using the design rules with a substantially uniform variant, which in this case is lengthening of conductor lines at the gaps as shown, as well as stretching of the width of the power rail FIGS. 6(a-b) illustrate a different stretch point being used only at the power rail.

The built-in commands in LibAnalyzer, as described and mentioned, can be used to stretch the various cells in the Standard cell Library 100-O to create the enhanced cells 100-N. A specific embodiment of the above-referenced stretching is obtained from standard cells and enhanced cells that conform to the following considerations:

An integrated circuit with at least a first standard cell logic region and a second standard cell logic region, each of said standard cell logic regions comprised of at least twenty side-by-side abutting standard cells, wherein each standard cell is rectangular in shape, with a height dimension defined by opposing elongated rectangular power and ground rails that extend longitudinally along an entire width dimension of the cell;

the first standard cell logic region further characterized by:

being comprised solely of standard cells of a uniform height H; and, including at least one cell that implements a first logic function;

the second standard cell logic region further characterized by:

being comprised solely of standard cells of a uniform height H', where H' is greater than 1.1×H; and, including at least one cell that also implements the first logic function;

and wherein:

the at least one cell that implements the first logic function in the first standard cell region has a same width, W, as the at least one cell that implements the first logic function in the second standard cell region; and, the at least one cell that implements the first logic function in the second standard cell region includes, between its respective power and ground rails, at least two distinct, non-stretched rectangular regions of width W and height greater than zero, and at least one stretched rectangular region of width W and height greater than zero, where a collective height of the non-stretched regions is greater than 0.8× the distance between the nearest edges of the respective power and ground rails in the at least one cell that implements the first logic function in the first standard cell region, and where each of the non-stretched regions consists essentially of patterning identical to that contained in a corresponding region of the at least one cell that implements the first logic function in the first standard cell region. In regard to the above, the stretched cell consists of non-stretched and stretched regions. The non-stretched regions copy patterning exactly from the non-stretched cell. The collective height, which is a sum of the heights of all non-stretched regions, being greater than 0.8× the distance requires that >80% of the patterning from the non-stretched cell be realized (as non-stretched regions) in the stretched cell.

In a particular embodiment, in the integrated circuit described above, the first standard cell logic region further includes at least one cell, of width W', that implements a second logic function and at least one cell, of width W", that implements a third logic function; and, the second standard cell logic region also further includes at least one cell, of width W', that implements the second logic function and at least one cell, of width W", that implements the third logic function;

wherein the at least one cell that implements the second logic function in the second standard cell region includes, between its respective power and ground rails, at least two distinct, non-stretched rectangular regions of width W' and height greater than zero, and at least one stretched rectangular region of width W' and height greater than zero, where the collective height of the non-stretched regions is greater than 0.8× the distance between the nearest edges of the respective power and ground rails in the at least one cell that implements the second logic function in the first standard cell region, and where each of the non-stretched regions consists essentially of patterning identical to that contained in a corresponding region of the at least one cell that implements the second logic function in the first standard cell region; and, wherein the at least one cell that implements the third logic function in the second standard cell region includes, between its respective power and ground rails, at least two distinct, non-stretched rectangular regions of width W" and height greater than zero, and at least one stretched rectangular region of width W" and height greater than zero, where the collective height of the non-stretched regions is greater than 0.8× the distance between the nearest edges of the respective power and ground rails in the at least one cell that implements the third logic function in the first standard cell region, and where each of the non-stretched regions consists essentially of patterning identical to that contained in a corresponding region of the at least one cell that implements the third logic function in the first standard cell region.

Some special cases may exist on smaller device widths that need adjusted to meet device size requirements. For example, one may want to add an additional fin to some devices in taller track height library for performance reasons.

Another manner in which stretching may occur to obtain the enhanced cells is to provide for a horizontal stretch of poly lines (also referred to as poly objects). When performing such a horizontal poly stretch, it is assumed that there is a uniform poly pitch across entire area of interest, and the centerline space from one poly object to its neighbor(s) is at a fixed distance. Based on this, cells are stretched by a fixed amount per poly pitch, with the same amount of stretching being done for every poly pitch. It is noted that the width of vertical objects (which are not the poly lines) can remained unchanged.

In a preferred embodiment, poly lines/polygons are either shifted or stretched by the stretch distance according to the following rules:

(a) If polygon spans at least 1 poly pitch (1CPP), it will stretch, and this typically applies to horizontal routing layers;

(b) A polygon spanning more than 1CPP will stretch by the stretch distance for each CPP that the object spans;

(c) If a polygon spans less than 1CPP, it will shift, which is typically the case for vertically oriented polygons;

(d) Shifted objects (that are not being stretched according to the horizontal stretch of poly lines) remain in the same position relative to the stretched poly line, such that an objected centered over poly remains center over poly regardless of the stretch amount, and objects centered between two poly lines remain centered between those same two poly lines regardless of the stretch amount, while other objects which are therefore offset from poly maintain the same offset distance to the new poly position.

Figure 7B:
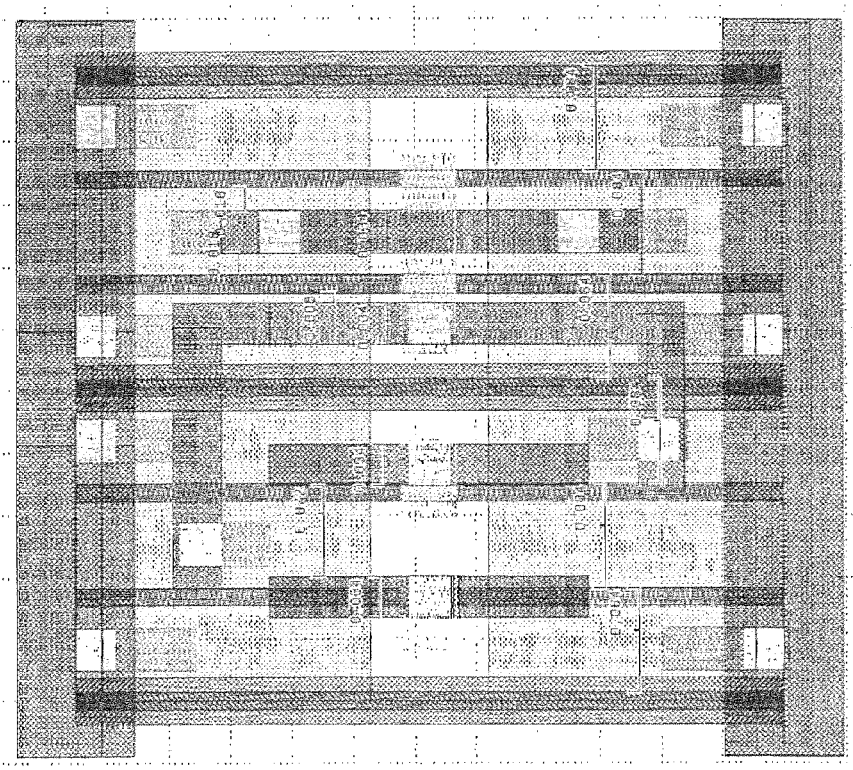
FIGS. 7(A-B) illustrates a specific implementation with numbered areas in FIG. 7B corresponding to discussion points in the specification herein.
Figure 7A:
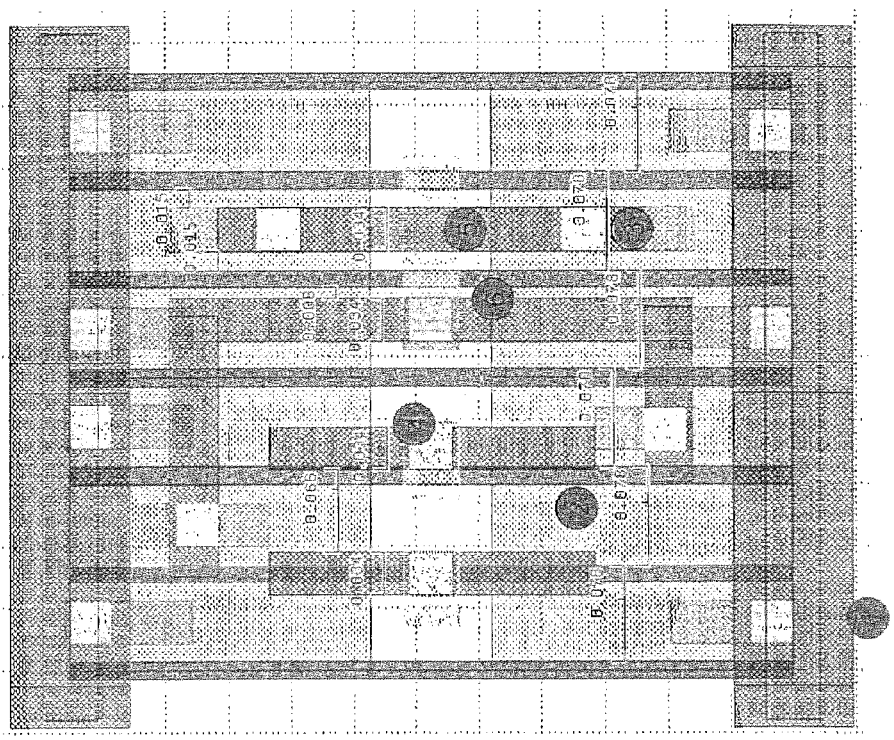

As shown in FIGS. 7(A-B) illustrate specific implementation, with at portions 1-6 of FIG. 7B, the following explanations with respect to each of the numbered areas 1-6 within circles are applicable:

1. All poly pitches uniformly stretched by 6 nm from 78 nm to 84 nm
2. Distance between two vertical objects increases based on stretch amount (66 nm to 72 nm)
3. Width of vertical layer remains unchanged at 34 nm
4. Horizontal route stretches consistent with the poly pitch stretch amount
5. Vertical objects centered between two poly remain centered. Half of stretch amount add to the space on each side of object.
6. Vertical object offset from poly edge by 8 nm remains offset by the same amount.

In addition to the above descriptions, U.S. Provisional Application Ser. No. 62/275,511, filed Jan. 6, 2016, and incorporated by reference herein, depicts an example of smart stretching in accordance with the present teachings.

FIGS. 2-45 of the '511 application depict a library of 6-track cells, whereas FIGS. 47-84 depict smart stretched, 7,5-track versions of the 6-track cells.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What we claim in this application is:

1. An integrated circuit, comprising:
at least a first standard cell logic region and a second standard cell logic region, each of said standard cell logic regions comprised of at least twenty side-by-side abutting standard cells, wherein each standard cell is rectangular in shape, with a height dimension defined by opposing elongated rectangular power and ground rails that extend longitudinally along an entire width dimension of the cell;
the first standard cell logic region further characterized by:
being comprised solely of standard cells of a uniform height H; and,
including at least one cell that implements a first logic function;
the second standard cell logic region further characterized by:
being comprised solely of standard cells of a uniform height H', where H' is greater than 1.1×H; and,
including at least one cell that also implements the first logic function;
and wherein:
the at least one cell that implements the first logic function in the first standard cell region has a same width, W, as the at least one cell that implements the first logic function in the second standard cell region; and,
the at least one cell that implements the first logic function in the second standard cell region includes, between its respective power and ground rails, at least two distinct, non-stretched rectangular regions of width W and height greater than zero, and at least one stretched rectangular region of width W and height greater than zero, where a collective height of the non-stretched regions is greater than 0.8× the distance between the nearest edges of the respective power and ground rails in the at least one cell that implements the first logic function in the first standard cell region, and where each of the non-stretched regions consists essentially of patterning identical to that contained in a corresponding region of the at least one cell that implements the first logic function in the first standard cell region.

2. An integrated circuit, as defined in claim 1, wherein:
the first standard cell logic region further includes at least one cell, of width W', that implements a second logic function and at least one cell, of width W'', that implements a third logic function; and,
the second standard cell logic region also further includes at least one cell, of width W', that implements the second logic function and at least one cell, of width W'', that implements the third logic function;
wherein the at least one cell that implements the second logic function in the second standard cell region includes, between its respective power and ground rails, at least two distinct, non-stretched rectangular regions of width W' and height greater than zero, and at least one stretched rectangular region of width W' and height greater than zero, where the collective height of the non-stretched regions is greater than 0.8× the distance between the nearest edges of the respective power and ground rails in the at least one cell that implements the second logic function in the first standard cell region, and where each of the non-stretched regions consists essentially of patterning identical to that contained in a corresponding region of the at least one cell that implements the second logic function in the first standard cell region; and,
wherein the at least one cell that implements the third logic function in the second standard cell region includes, between its respective power and ground rails, at least two distinct, non-stretched rectangular regions of width W'' and height greater than zero, and at least one stretched rectangular region of width W'' and height greater than zero, where the collective height of the non-stretched regions is greater than 0.8× the distance between the nearest edges of the respective power and ground rails in the at least one cell that implements the third logic function in the first standard cell region, and where each of the non-stretched regions consists essentially of patterning identical to that contained in a corresponding region of the at least one cell that implements the third logic function in the first standard cell region.

3. The integrated circuit according to claim 1 wherein the uniform height H' is for an increased height of transistor gates.

4. The integrated circuit according to claim 3 wherein the increased height of transistor gates is proportionally larger for all the cells in the second standard cell region as compared to the cells in the first standard cell region.

5. The integrated circuit according to claim 1 wherein another difference between the first standard cell logic region and the second standard cell logic region includes a lengthening of metal conductor lines.

6. The integrated circuit according to claim 1 wherein another difference between the the first standard cell logic region and the second standard cell logic region includes an increased width of a power rail and a ground rail.

7. The integrated circuit according to claim 1 wherein each of the first and second standard cell regions include cells that implement at least three of: AND, OR, NOT, NAND, NOR, XOR, XNOR, AOI, or OAI logic functions.

* * * * *